US011455562B2

(12) United States Patent
Kachman et al.

(10) Patent No.: US 11,455,562 B2
(45) Date of Patent: Sep. 27, 2022

(54) QUANTUM WALK FOR COMMUNITY CLIQUE DETECTION

(71) Applicant: INTERNATIONAL BUSINESS MACHINES CORPORATION, Armonk, NY (US)

(72) Inventors: Tal Kachman, Haifa (IL); Lior Horesh, North Salem, NY (US); Giacomo Nannicini, New York, NY (US); Mark S. Squillante, Greenwich, CT (US); John A. Gunnels, Somers, NY (US); Kenneth L. Clarkson, Madison, NJ (US)

(73) Assignee: International Business Machines Corporation, Armonk, NY (US)

( * ) Notice: Subject to any disclaimer, the term of this patent is extended or adjusted under 35 U.S.C. 154(b) by 556 days.

(21) Appl. No.: 16/573,862

(22) Filed: Sep. 17, 2019

(65) Prior Publication Data

US 2021/0406954 A1 Dec. 30, 2021

(51) Int. Cl.
*G06N 10/00* (2022.01)
*G06F 17/11* (2006.01)
(Continued)

(52) U.S. Cl.
CPC ............. *G06N 10/00* (2019.01); *G06F 17/11* (2013.01); *G06N 5/003* (2013.01); *G06N 10/60* (2022.01); *H03K 19/195* (2013.01)

(58) Field of Classification Search
CPC ........ G06F 17/11; G06N 5/003; G06N 10/00; G06N 10/60; H03K 19/195
See application file for complete search history.

(56) References Cited

U.S. PATENT DOCUMENTS 7,870,087 B2   1/2011  Macready et al.
8,032,474 B2  10/2011  Macready et al.
(Continued)

FOREIGN PATENT DOCUMENTS

WO       2016141481 A1    9/2016

OTHER PUBLICATIONS

Sanyal(Bhaduri) A. et al. "Circuit Synthesis of Marked Clique Problem using Quantum Walk." Advanced Computing and Systems for Security. Advances in Intelligent Systems and Computing, vol. 567, pp. 37-51.

(Continued)

*Primary Examiner* — Kurtis R Bahr
(74) *Attorney, Agent, or Firm* — Henry J. Daley; Venable LLP

(57) ABSTRACT

A method of detecting cliques in a graph includes determining, based on a number of nodes in the graph, a number of qubits to be included in a quantum processor. The method includes assigning to each node in the graph, a qubit of the quantum processor. The method includes operating on the qubits with a preparation circuit to create a quantum state in the qubits that corresponds to the graph. The method includes operating on the quantum state with a random walk circuit, and measuring the qubits of the quantum processor to detect cliques in the graph. The preparation circuit comprises a plurality of single- and two-qubit operators, wherein, for each pair of adjacent nodes in the graph, an operator of the plurality of two-qubit operators acts on a pair of qubits corresponding to the pair of adjacent nodes to create the quantum state.

20 Claims, 9 Drawing Sheets

(51) Int. Cl.
*H03K 19/195* (2006.01)
*G06N 5/00* (2006.01)
*G06N 10/60* (2022.01)

(56) References Cited

U.S. PATENT DOCUMENTS

| | | | |
|---|---|---|---|
| 8,244,662 B2 | 8/2012 | Coury et al. | |
| 10,909,465 B2* | 2/2021 | Tsomokos | G06Q 30/0201 |
| 11,301,774 B2* | 4/2022 | Garcia Duran | G06N 5/04 |
| 2004/0111390 A1* | 6/2004 | Saito | G06F 11/1435 |
| 2004/0111441 A1* | 6/2004 | Saito | G06F 16/1834 |
| 2008/0116449 A1 | 5/2008 | Macready et al. | |
| 2011/0060711 A1 | 3/2011 | Macready et al. | |
| 2018/0039903 A1 | 2/2018 | Mosca et al. | |
| 2018/0137155 A1 | 5/2018 | Majumdar | |
| 2018/0246851 A1* | 8/2018 | Zaribafiyan | G06F 17/18 |
| 2020/0349457 A1* | 11/2020 | Low | G06N 10/00 |

OTHER PUBLICATIONS

Reitzner et al., "Quantum Walks", Acta Physica Slovaca. Reviews and Tutorials 61.6 (2011): 603-725.

Chakaravarthy et al., "Subgraph Counting: Color Coding Beyond Trees" Feb. 2018, arXiv:1602.04478v2 [cs.DC] pp. 1-42.

Magniez et al., "Quantum Algorithms for the Triangle Problem", Dec. 14, 2005, arXiv:quant-ph/0310134v3 pp. 1-12.

Chapuis et al., "Finding Maximum Cliques on the D-Wave Quantum Annealer", Apr. 24, 2018, arXiv:1801.08649v3 [quant-ph], pp. 1-23.

Rønnow et al., "Defining and detecting quantum speedup", Science Jul. 25, 2014: vol. 345, Issue 6195, pp. 420-424.

Wie, "A Quantum Circuit to Construct All Maximal Cliques Using Grover's Search Algorithm", Nov. 14, 2017 arXiv:1711.06146 [quant-ph], pp. 1-13.

\* cited by examiner ( nx.adj_matrix(G).todense( )**2 )

700 → matrix( [ [2, 0, 2, 0, 2],
               [0, 3, 0, 3, 0],
               [2, 0, 2, 0, 2],
               [0, 3, 0, 3, 0],
               [2, 0, 2, 0, 2]], dtype=int 64 )

702 → matrix( [ [0, 6, 0, 6, 0],
               [6, 0, 6, 0, 6],
               [0, 6, 0, 6, 0],
               [6, 0, 6, 0, 6],
               [0, 6, 0, 6, 0]], dtype=int 64 )  •••

```
def walk(num_iterations, parameters):
    """Perform a quantum random walk for num_iteration steps using parameters
    for the coin transformation"""
    state = [( (0, 0), 1 )]
    for i in range(num_iterations):
        state = flip(state, parameters)
        state = simplify(state)
        state = shift(state)
        state = simplify(state)
    return state def plot_state(state):
    """Plots the state vector"""
    min_val = min(state, key=lambda ka: ka[0] [0] [0] [0])
    max_val = max(state, key=lambda ka: ka[0] [0] [0] [0])
    X = np.arange(min_val, max_val+1)
    Y = np.zeros( (len(X) ) )
    for i, x in enumerate(X):
        for ket, amp in state:
            if ket( 0 ) == x:
                Y(i) += abe (amp) **2
    plt.plot(X,Y)
    plt.ylabel("$|\psi(x) | ^2$")
    plt.xlabel("$x$)
    plt.title("Quantum Random Walk")
    plt.show( )

def main( ):
    parameters = (2**-.5, 2**-.5, 2**-.5, -2**-.5,) # Hadamard Transformation
    state = walk(100, parameters)
    plot_state(state)
    plt.show( )

if __name__ == '__main__':
    main( )
```

FIG. 8A

```
def flip(state, parameters):
    """Coin Transformation C"""
    new_state = [ ]
    a, b, c, d = parameters
    for ket, amp in state:
        n, coin = ket
        if coin == 0:
            new_state.append( ( (n, 0), a*amp) )
            new_state.append( ( (n, 1), b*amp) )
        elif coin == 1:
            new_state.append( ( (n, 0), c*amp) )
            new_state.append( ( (n, 1), d*amp) )
    return new_state def shift(state):
    """Shift Transformation S"""
    new_state = [ ]
    for ket, amp in state:
        n, coin = ket
        if coin == 1:
            new_state.append( ( (n+1), coin), amp) )
        if coin == 0:
            new_state.append( ( (n-1), coin), amp) )
    return new_state def simplify(state):
    """Combines like terms in the state vector"""
    kets = [ ]
    new_state = [ ]
    for ket, amp in state:
        if ket not in kets:
            new_amp = sum(a for k, a in state if k == ket)
            kets.append(ket)
            new_state.append( (ket, new_amp) )
    return new_state
```

FIG. 8B

QUANTUM WALK FOR COMMUNITY CLIQUE DETECTION

STATEMENT OF GOVERNMENT SUPPORT

This invention was made with government support under FA8750-18-C-0098 awarded by the U.S. Air Force, Office of Scientific Research. The government has certain rights in the invention.

BACKGROUND

The currently claimed embodiments of the present invention relate to systems and methods for community clique detection, and more specifically, to use of a quantum walk for the community clique detection.

Network theory is a field of research that is spreading to many disciplines such as physics, engineering, biology, sociology, and economics, and plays a fundamental role. Most interaction systems in nature can be constructed or thought of in graph terms. A graph includes a finite set of items, referred to as "nodes" or "vertices," which are connected by edges. An edge connects two adjacent nodes. A clique is a subset of the nodes wherein every two distinct nodes are adjacent. Most versions of the clique problem are computationally hard and the clique decision problem is NP-complete.

Finding cliques on a graph has widespread applications in social media, logistical problems, networks, and communication. For example, efficient logistics rely on an optimal way to distribute products and goods. Inferring cliques and moving distribution to localized regions can have great economic value. Directed marketing is another industry where improved clique identification can have vast implications, enabling better targeted community advertisement. Any computational advantage in finding cliques can have great repercussions.

SUMMARY

According to an embodiment of the present invention, a method of detecting cliques in a graph includes determining, based on a number of nodes in the graph, a number of qubits to be included in a quantum processor. The method includes assigning to each node in the graph, a qubit of the quantum processor having the determined number of qubits. The method includes operating on the qubits of the quantum processor with a preparation circuit to create a quantum state in the qubits that corresponds to the graph. The method includes operating on the quantum state in the qubits with a random walk circuit, and measuring the qubits of the quantum processor to detect cliques in the graph based on the operating with the random walk circuit. The preparation circuit comprises a plurality of single- and two-qubit operators, wherein, for each pair of adjacent nodes in the graph, an operator of the plurality of two-qubit operators acts on a pair of qubits corresponding to the pair of adjacent nodes to create the quantum state.

According to an embodiment of the present invention, a quantum processor for detecting cliques in a graph includes a number of qubits equal to a number of nodes in the graph, wherein each qubit corresponds to a node in the graph. The quantum processor includes a quantum preparation circuit configured to prepare the qubits of the quantum processor in a quantum state corresponding to the graph, the quantum preparation circuit comprising a plurality of two-qubit operators. The quantum processor includes a random walk circuit configured to operate on the qubits prepared in the quantum state, and a measurement circuit configured to measure the qubits of the quantum processor to provide an indication of cliques in the graph. For each pair of adjacent nodes of the graph, a two-qubit operator of the plurality of two-qubit operators is configured to operate on a pair of qubits corresponding to the pair of adjacent nodes to create the quantum state.

BRIEF DESCRIPTION OF THE DRAWINGS

FIGS. 8A and 8B show an example implementation of the method according to an embodiment of the present invention.

DETAILED DESCRIPTION

Figure 1:
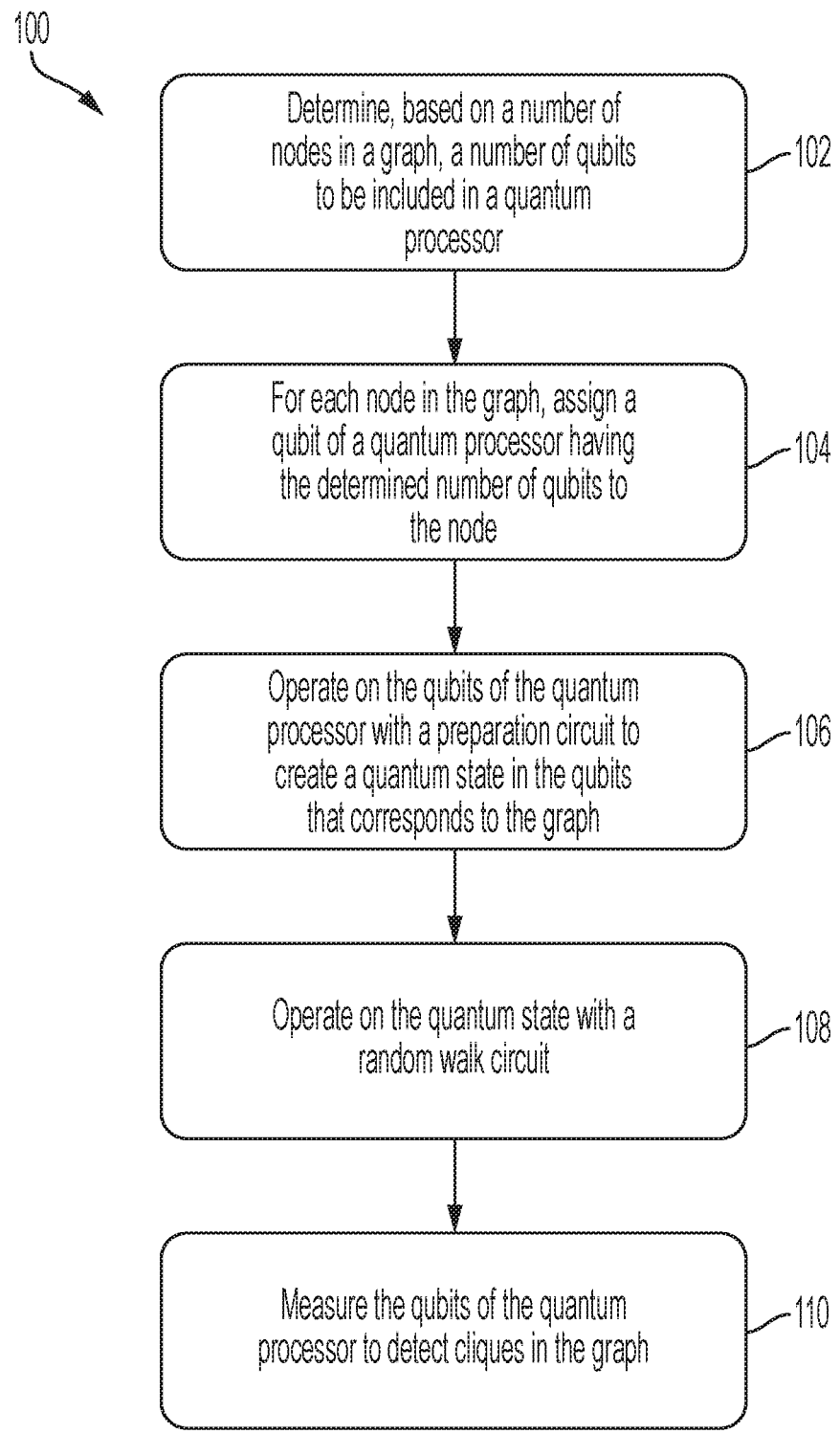
FIG. 1 is a flowchart that illustrates a method of detecting cliques in a graph according to an embodiment of the present invention.

FIG. 1 is a flowchart that illustrates a method 100 of detecting cliques in a graph according to an embodiment of the present invention. The method 100 includes determining, based on a number of nodes in the graph, a number of qubits to be included in a quantum processor 102. The method 100 includes assigning to each node in the graph, a qubit of the quantum processor having the determined number of qubits 104. The method 100 includes operating on the qubits of the quantum processor with a preparation circuit to create a quantum state in the qubits that corresponds to the graph 106. The method 100 includes operating on the quantum state in the qubits with a random walk circuit 108, and measuring the qubits of the quantum processor to detect cliques in the graph based on said operating with said random walk circuit 110. The preparation circuit includes a plurality of single- and two-qubit operators, wherein, for each pair of adjacent nodes in the graph, an operator of the plurality of two-qubit operators acts on a pair of qubits corresponding to the pair of adjacent nodes to create the quantum state.

Figure 2:
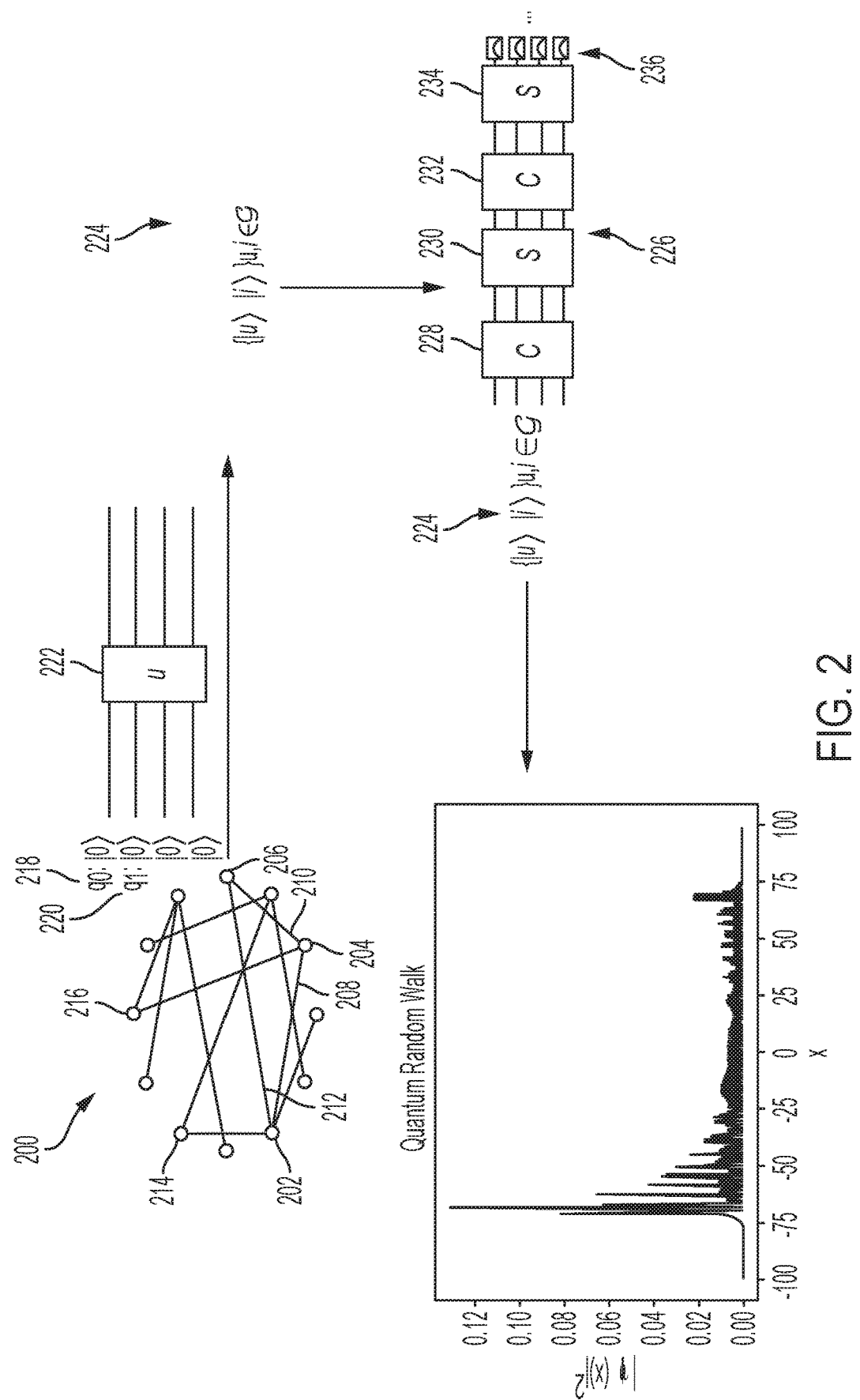
FIG. 2 further illustrates the method of detecting cliques in a graph according to an embodiment of the present invention.

FIG. 2 further illustrates the method of detecting cliques in a graph according to an embodiment of the present invention. FIG. 2 shows an example graph 200 that includes a plurality of nodes 202, 204, 206, connected by edges 208, 210, 212. Because nodes 202 and 204 are vertices of a single edge 208, they are adjacent. Similarly, nodes 204 and 206 are vertices of the edge 210, and are therefore adjacent. Because each of nodes 202, 204, and 206 are adjacent to each other node 202, 204, and 206, the three nodes form a clique. The other nodes in the graph 200, for example, nodes 214, 216 are not included in the clique.

The method includes determining, based on the number of nodes in the graph, a number of qubits to be included in a quantum processor. For example, for the graph 200, the number of nodes is 12. According to an embodiment of the current invention, the quantum processor includes a qubit for each of the 12 nodes.

The method includes, for each node in the graph, assigning a qubit of the quantum processor having the determined number of qubits to the node. For example, a first qubit $q_0$ 218 could be assigned to node 202, a second qubit $q_1$ 220 could be assigned to node 204, and so on, until every node in the graph 200 has been assigned to a qubit of the quantum processor.

The method includes operating on the qubits of the quantum processor with a preparation circuit 222 to create a quantum state 224 in the qubits that corresponds to the graph 200. Although the preparation circuit 222 in FIG. 2 is shown to act on four qubits, the preparation circuit 222 is not limited to this size. For example, for a graph having 20 nodes, such as graph 200, the preparation circuit 222 may act on 20 qubits. The preparation circuit 222 includes a plurality of single- and two-qubit operators. For each pair of adjacent nodes in the graph, an operator of the plurality of two-qubit operators acts on a pair of qubits corresponding to the pair of adjacent nodes to create the quantum state. For example, in the graph 200, node 202 and node 204 are adjacent. Assuming these nodes are assigned to a first qubit $q_0$ 218 and a second qubit $q_1$ 220, a two-qubit operator acts on the first qubit $q_0$ 218 and the second qubit $q_1$ 220 to create the quantum state. The two-qubit operator may be, for example, an operator that flips the parity of the pair of qubits 218 and 220. The two-qubit operator may be, for example, a controlled Pauli X operator. The result of the preparation circuit 222 is a quantum state in the qubits 218, 220 that corresponds to the graph 200. The preparation circuit 222 acts on each pair of qubits corresponding to adjacent nodes in the graph 200 to create the quantum state 224.

The method includes operating on the quantum state 224 in the qubits with a random walk circuit 226, and measuring the qubits of the quantum processor to detect cliques in the graph 200 based on the operating with the random walk circuit 226. According to an embodiment of the present invention, the random walk circuit 226 includes a coin operator 228 and a step operator 230. The coin operator 228 may be a biased coin operator or an unbiased coin operator, for example. The step operator 230 may be a conditional operator that changes a position state of the quantum state. Eigenvalues of higher powers of the coin operator 228 and the step operator 230 provide a measure of self-cliques.

According to an embodiment of the present invention, the random walk circuit 226 includes a pair of operators that are repeated to evaluate a plurality of paths through the graph in parallel. For example, in FIG. 2, the coin operator 228 and the step operator 232 are followed by another coin operator 232 and another step operator 234. The pair of operators are repeated to evaluate a plurality of paths, where the paths are different routes that can be traversed on the graph. The pair of operators may be repeated many times, for example, more than five, ten, fifty, or one hundred times. The number of times that the pair of operators is repeated may depend on a diameter of the graph. For example, if the graph is a binary tree, then for each level of the tree, the number of coin and step operations is double that of the previous level. However, embodiments of the invention are not limited to binary graphs. The larger the diameter of the graph, the more coin and step operations are included to traverse the graph. According to an embodiment of the present invention, the number of pairs of operators may be on the order of the log of the diameter of the graph. The diameter of a graph is equal to the greatest distance between any two vertices in the graph.

After operation of the random walk circuit 226, the qubits may be measured by a measurement circuit 236. If the state is not in the measurement basis (for example, the Z basis), then a transformation may be applied to rotate the state to the measurement basis prior to measurement. The output of the measurement circuit is a bitstring that provides a single realization of the $k^{th}$ power of the adjacency matrix. For example, the single realization may be $(-1)^{\Sigma m_i}$, where $m_i$ are measurements in the computational basis of the respective qubits $q_i$, and $\Sigma$ is a summation modulo 2.

The output of the measurement circuit may be used to reconstruct the state vector, for example, some form of tomography, and thus build a probability distribution for the position of the walker after a certain number of steps. With this information, one can compute $\langle \psi | A^k | \psi \rangle$ where $A^k$ is the $k^{th}$ power of the adjacency matrix.

The $k^{th}$ power of the adjacency matrix can be used to gain information about cliques in the graph. For example, the $k^{th}$ power of the adjacency matrix can be used to find a lower bound of the clique number of the graph. The $k^{th}$ root (computed classically) of the trace of the $k^{th}$ power of the adjacency matrix (computed using the random walk circuit 226) is one way to estimate the leading eigenvalue. The leading eigenvalue can be used to calculate a lower bound for the clique number. To detect longer cliques, one can compute the trace of various powers of the adjacency matrix.

The random walk circuit 226 and measurement circuit 236 may be run multiple times, and an average may be taken over the measurement outputs. The number of times that the random walk circuit 226 and measurement circuit 236 are executed may depend on the desired precision level $\epsilon$. The number of samples would generally grow like $O(1/\epsilon^2)$.

Figure 3:
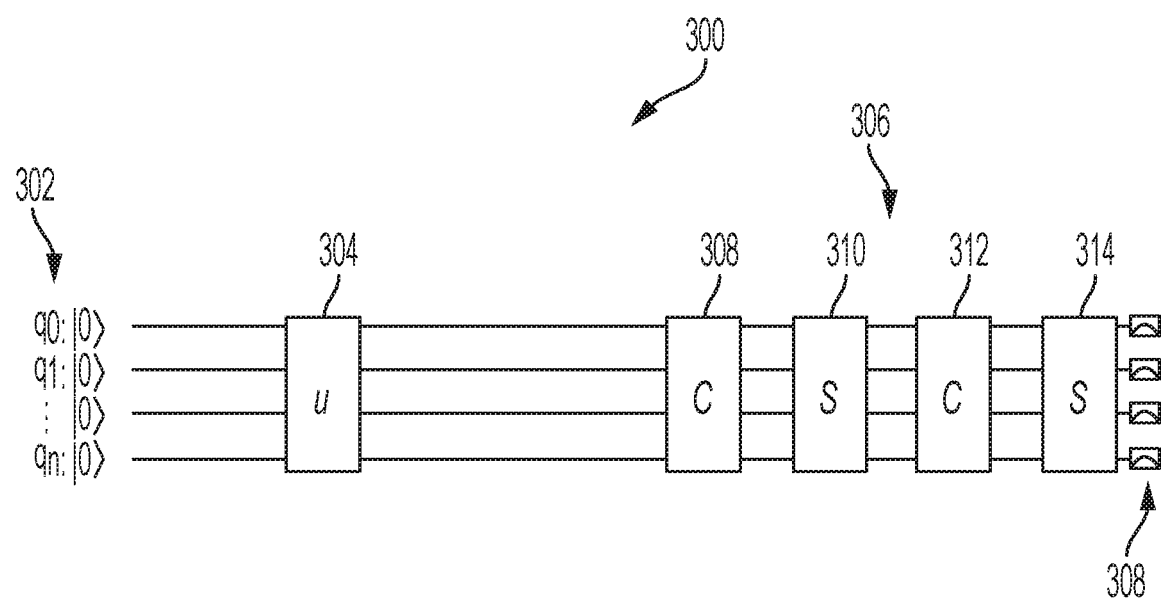
FIG. 3 is a schematic illustration of a quantum processor for detecting cliques in a graph according to an embodiment of the present invention.

FIG. 3 is a schematic illustration of a quantum processor 300 for detecting cliques in a graph according to an embodiment of the present invention. The quantum processor 300 includes a number of qubits 302 equal to a number of nodes in the graph. Each qubit corresponds to a node in the graph. The quantum processor 300 includes a quantum preparation circuit 304 configured to prepare the qubits 302 of the quantum processor 300 in a quantum state corresponding to the graph. The quantum preparation circuit 304 includes a plurality of two-qubit operators. For each pair of adjacent nodes of the graph, a two-qubit operator of the plurality of two-qubit operators is configured to operate on a pair of qubits corresponding to the pair of adjacent nodes to create the quantum state. The quantum processor 300 includes a random walk circuit 306 configure to operate on the qubits 302 prepared in the quantum state, and a measurement circuit 308 configured to measure the qubits 302 of the quantum processor to provide an indication of cliques in the graph.

According to an embodiment of the present invention, the operator of the plurality of two-qubit operators of the preparation circuit 304 acts on the pair of qubits corresponding to the pair of adjacent nodes to create the quantum state by flipping a parity of the pair of qubits. According to an embodiment of the present invention, the random walk circuit 306 includes a coin operator 308 and a step operator 310. The coin operator 308 may be a biased coin operator or an unbiased coin operator. The step operator 310 may be a conditional operator that changes a position state of the quantum state. Eigenvalues of higher powers of the coin operator 308 and the step operator 310 provide a measure of self-cliques.

According to an embodiment of the present invention, the random walk circuit 306 includes a pair of operators that are repeated to evaluate a plurality of paths through the graph in parallel. For example, the coin operator 308 and the step operator 310 may be followed by another coin operator 312 and another step operator 314. The pair of operators may be repeated many times, for example, more than five, ten, fifty, or one hundred times. The number of times that the pair of operators is repeated may depend on a diameter of the graph. The pair of operators are repeated to evaluate a plurality of paths, where the paths are different routes that can be traversed on the graph.

The quantum random walk is the quantum analog to the classical random walk. Consider any classical system undergoing random transitions between a discrete set of possibilities. Let a column vector π with each term nonnegative and summing to one define a probability distribution over these states. For each possible state, there is a corresponding column vector that provides the probability of transition to every other state. Accordingly, transitions to another state via a random process can be described by a Markov transition matrix which we will denote here by P, where the ijth element of P is given by $P_{ij}=P(i|j)$.

Following the dynamics of the stochastic process, we can write the state as $$P\pi(t)=\pi(t+1)$$

for example, if the process is a simple random walk on a one dimensional lattice, then P will naturally be the discrete adjacency matrix $$P = \begin{pmatrix} \ddots & & & \\ \frac{1}{2} & 0 & \frac{1}{2} & \\ & \frac{1}{2} & 0 & \frac{1}{2} \\ & & & \ddots \end{pmatrix}$$

and a particle at position n will transition to positions n−1 and n+1 each with probability ½.

The dynamics generated by such a Markovian process are actually very similar to the quantum dynamics generated by the Schrödinger evolution operator $$|\psi(t+1)\rangle = U|\psi(t)\rangle$$

where ψ is a vector square integrable vector in Hilbert space $\langle \psi(t)|\psi(t)\rangle =1$ and U takes the role of the Markov propagation. In fact, one can attain the classical limit by performing projective measurement (in the steady state regime) onto basis state after each propagation step, thus turning U into a generator of a classical stochastic process with the limit $$P_{ij}=U_{ij}*U_{ij}=|U_{ij}|.$$

In fact, this "classical limit" is the natural way in which a quantum operation suggests a random walk. We call such a quantum system when thought of in the context of the random walk a quantum random walk.

As an illustrative example let us look at how a quantum random walk is defined on a one dimensional lattice, and focus on just one lattice point. The probability of finding the particle at position n at time T p(n, T) is zero if n+T is odd and otherwise given by $$p(n,T) = \frac{1}{2^T}\begin{pmatrix} T \\ \frac{1}{2}(n+T) \end{pmatrix}, \text{ if } n+T \text{ even}$$

with the following moments $\langle n \rangle = 0$, $\sigma^2 = \langle (n-\langle n \rangle)^2 \rangle = T$.

The quantum walk is defined in the Hilbert space $\mathcal{H}_s \otimes \mathcal{H}_c$. The space $\mathcal{H}_s$ is a discrete position states $|n\rangle$ of dimension n while $\mathcal{H}_c$ is a "coin" space of size two, in charge of the transition actions. To symbolize the actions, we label a set of orthonormal basis vectors in $\mathcal{H}_c$ as $|+\rangle$ and $|-\rangle$ with the associated "coin" action C for the walk "decision" given by $$\begin{cases} C|+\rangle = a|-\rangle + b|+\rangle \\ C|-\rangle = a|-\rangle - b|+\rangle \end{cases}$$

and the shift operator S in $\mathcal{H}_c$ associated with the walk "step" given by $$\begin{cases} S|n, +\rangle = |n-2, -\rangle \\ S|n, -\rangle = |n+2, +\rangle \end{cases}$$

In fact, the evolution of the quantum random walk in one time step is therefore given by $U=S(I \otimes C)$.

One instance of a coin operator is the Hadamard gate $$H = \frac{1}{\sqrt{2}}\begin{pmatrix} 1 & 1 \\ 1 & -1 \end{pmatrix}$$

or for the balanced coin $$Y = \frac{1}{\sqrt{2}}\begin{pmatrix} 1 & i \\ i & 1 \end{pmatrix}$$

while the shift operator embodies the topological structure of the graph. For a one-dimensional lattice topology (line), we have $$S = \Sigma_{n=-\infty}^{\infty}(|n+1\rangle\langle n| \otimes |+\rangle\langle +|+|n-1\rangle\langle n| \otimes |-\rangle\langle -|).$$

For example, using the Hadamard coin operator will result, for an initial state $|\psi\rangle = |0, +\rangle$, in the following dynamics:

$$|\psi\rangle \xrightarrow{U} \frac{1}{\sqrt{2}}|-1, -\rangle - \frac{1}{\sqrt{2}}|1, +\rangle$$

$$\xrightarrow{U} \frac{1}{2}|-2, -\rangle - \frac{1}{2}|0, -\rangle + \frac{1}{2}|0, +\rangle - \frac{1}{2}|2, -\rangle$$

$$\xrightarrow{U} \frac{1}{2\sqrt{2}}|-3, -\rangle + \frac{1}{2\sqrt{2}}|-1, +\rangle +$$

$$\frac{1}{\sqrt{2}}|-1, -\rangle - \frac{1}{2\sqrt{2}}|1, -\rangle + \frac{1}{2\sqrt{2}}|3, +\rangle$$

With this example we already see the onset of quantum effects. After two steps of the operator U, the probability of measuring the particle at any position remains the same as for a classical random walk, but on the third step, the probabilities change. Positive moving amplitudes at n=1 interfere destructively simultaneously with constructive interference at n−1. This leads to a probability ⅝ of the particle being measured in the state |−1⟩ but only a probability ⅛ at |1⟩.

Figure 4:
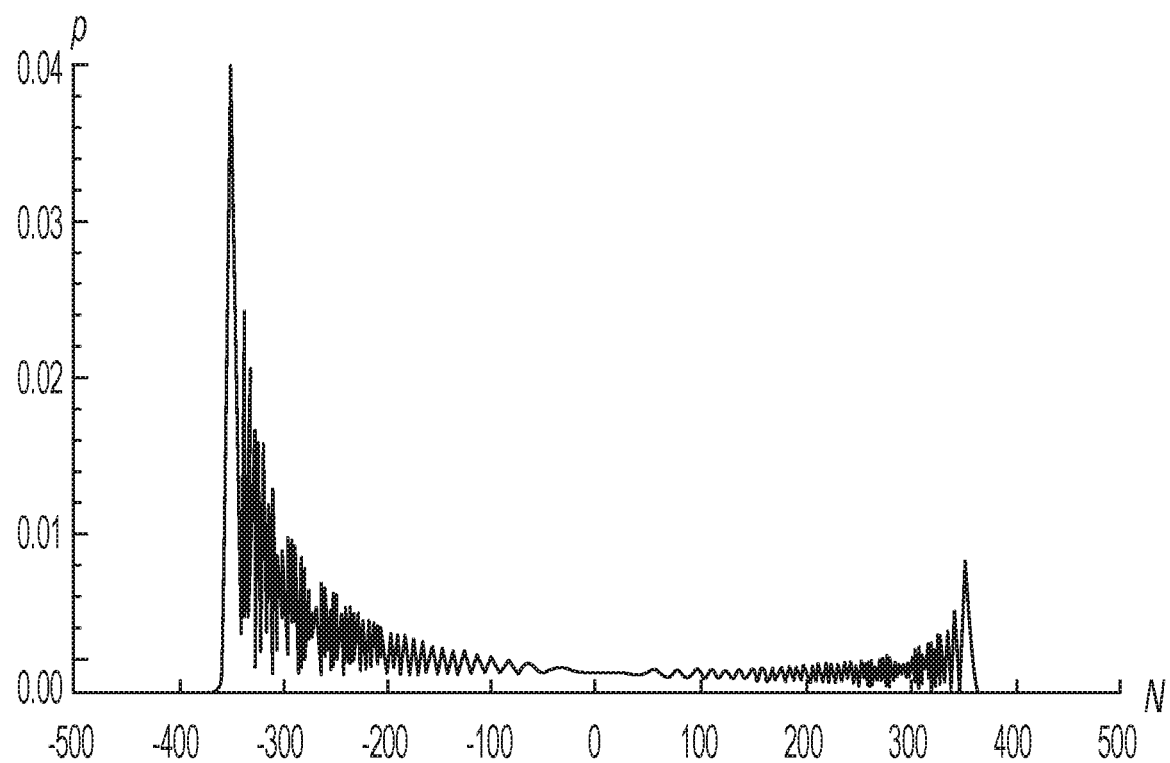
FIG. 4 shows a probability distribution for a biased quantum random walker.
Figure 5:
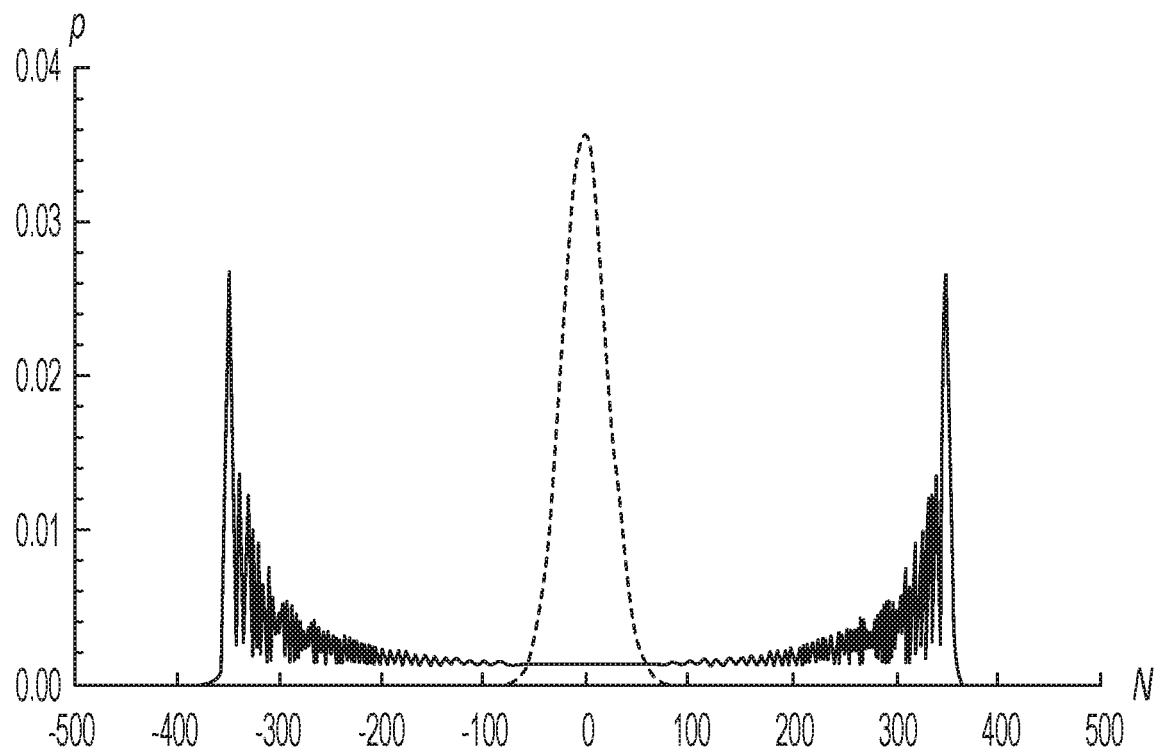
FIG. 5 shows a probability distribution for an unbiased quantum (solid curve) and classical (dashed curve) random walker.

More strikingly, the difference in the choice of the coin operator is shown in FIG. 4 and FIG. 5. FIG. 4 shows a probability distribution for a biased quantum random walker. FIG. 5 shows a probability distribution for an unbiased quantum (solid curve) and classical (dashed curve) random walker. One can see the probability flux generated by the bias in the Hadamard gate (FIG. 4) and the symmetric probability measure in the fair coin in which amplitude is distributed symmetrically between different sections of the lattice (FIG. 5). FIG. 5 illustrates how the quantum random walk expands much more quickly than the classical random walk, enabling large information areas to be explored, and cliques to be detected.

In the same way that we have defined the quantum walk on a line, we can expand the space to an arbitrary undirected graph by using different position and coin spaces. Similar to the quantum walk on a line, we can define the process on a composite Hilbert space $$\mathcal{H}_s \otimes \mathcal{H}_c$$

where, as before, the position space has discrete values and is the dimension of the number of nodes, but the coin space is now of size n where n is the number of paths connected to a node state=|v,i⟩
S|v,i⟩=|v',i'⟩ where v' is the other vertex attached to edge marked by i', and i' is the labeling for the index associated with the same edge marked by i.

In general, the coin operator C may also be chosen arbitrarily, for example the discrete Fourier transform (DFT) (which is natural extension of the Hadamard coin). Another possible operator is the extension of the fair coin operator Y $$G = \begin{pmatrix} -1+\frac{2}{n} & \frac{2}{n} & & & & \frac{2}{n} \\ \frac{2}{n} & -1+\frac{2}{n} & & & & \\ & & -1+\frac{2}{n} & & & \\ & & & -1+\frac{2}{n} & & \\ \frac{2}{n} & & & & \frac{2}{n} & -1+\frac{2}{n} \end{pmatrix}$$

which is the diffusion operator G from Grover's search algorithm, $$G = -I + 2|\psi\rangle\langle\psi|$$

where ψ is the basis of the coin space $$|\psi\rangle = \frac{1}{\sqrt{n}} \sum_{i=1}^{n} |i\rangle.$$

Quantum walks are at the heart of modern quantum technologies. They allow us to deal with quantum transport phenomena and are an advanced tool for constructing novel quantum algorithms. Quantum walks on graphs are fundamentally different from classical random walk analogs. In particular, they walk faster than classical random walks on certain graphs, enabling in these cases quantum algorithmic application. In recent years there has been an increase in the use of quantum and classical walkers as novel algorithms for search and satisfyability problems. This stems from the fact that depending on certain symmetries and local structures, a quantum walker can achieve a polynomial or even exponential speed up.

The fact that speedups are dependent on local structure means quantum random walkers can be used as a probing mechanism to such local structures by measuring expansion coefficients or other related observables. Such local structures are deeply interconnected with the formation and characterization of cliques.

A clique, C, in an undirected graph G=(V, E) is a subset of the vertices, C∈V, such that every two distinct vertices are adjacent. The computational problem of finding cliques in a graph can have several different formulations depending on which cliques, and what information about the cliques, should be found. Most versions of the clique problem are competently hard, for example the clique decision problem is NP-complete.

Cliques arise in a multitude of settings such as social networks, logistics, biological communities and can hold the key to real-world large-scale applications. As such there is a clear interest in more efficient algorithms to detect them.

One method for exploring such structures is by looking at the different powers of the adjacency matrix. For an adjacency matrix A, the $a_{ij}$ term is an indicator function of the path between i and j. The $n^{th}$ power of the adjacency matrix $A^n$ has a special meaning where the $a_{ij}$ term is the number of paths of stride n between i and j.

Once the adjacency matrix is raised to the different powers one can gain diagonal terms in the new adjacency matrix. Such terms $a_{ii}$ are the numbers of paths from i back to i and in fact are in indication of loops. By taking different powers and seeing how the spectrum or the trace of the adjacency matrix grows we can gain the indication of the local structure. An illustrative example of this is given in FIG. 6 and FIG. 7.

Figure 6:
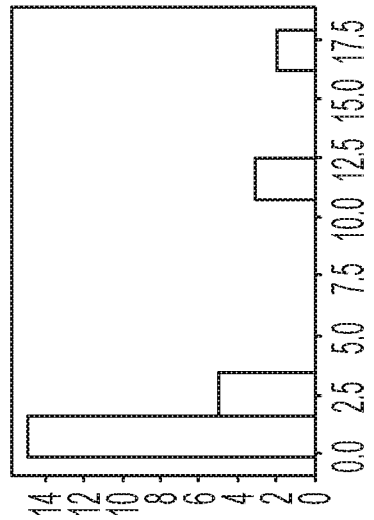
FIG. 6 shows an example graph and corresponding adjacency matrix.
Figure 6:
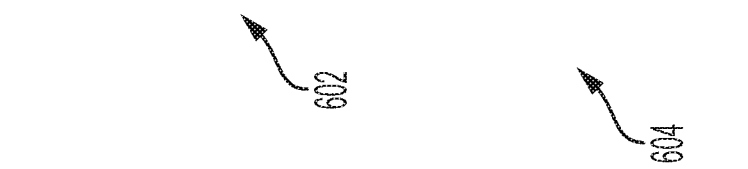

FIG. 6 shows an example graph 600 and corresponding adjacency matrix 602. By looking at the trace of the adjacency matrix, one can get probabilities for different cliques. The bar graph 602 is a plot of the diagonal elements of an example adjacency matrix (not shown).

Figure 7A:
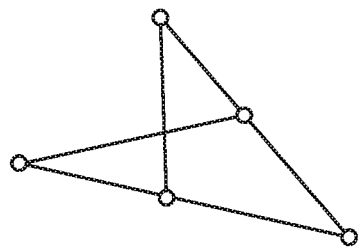
FIGS. 7A-7C illustrate how element $a_{ij}$ of the $n^{th}$ power of the adjacency matrix gives the number of paths of length n between i and j.
Figure 7A:
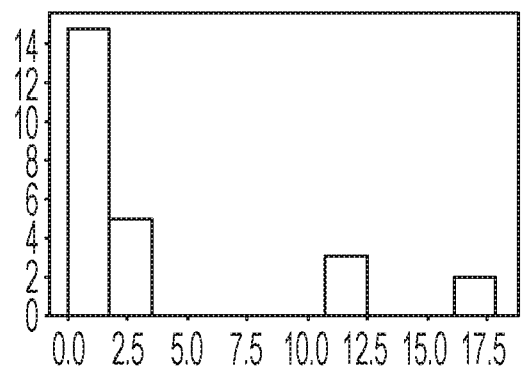
Figure 7A:
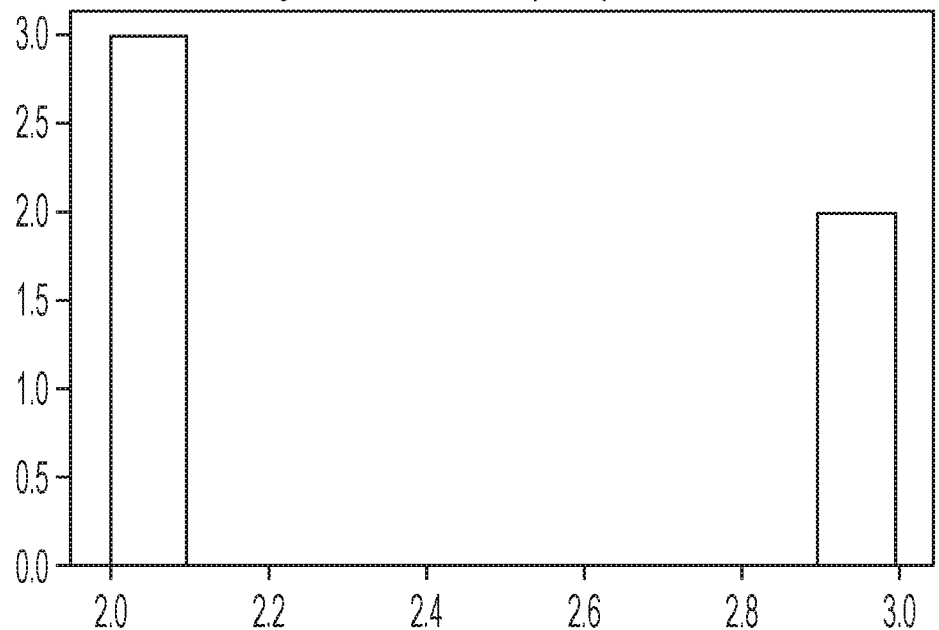
Figure 7B:
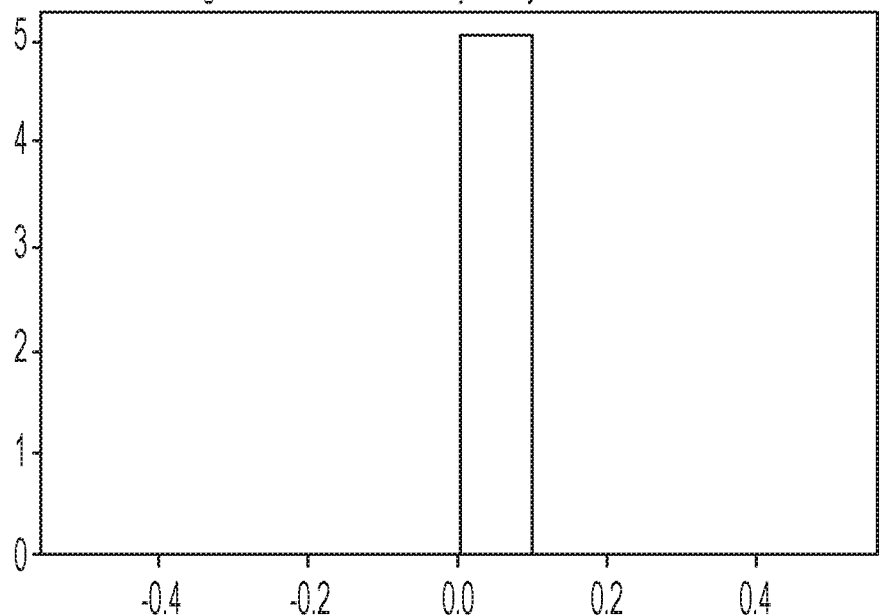
Figure 7C:
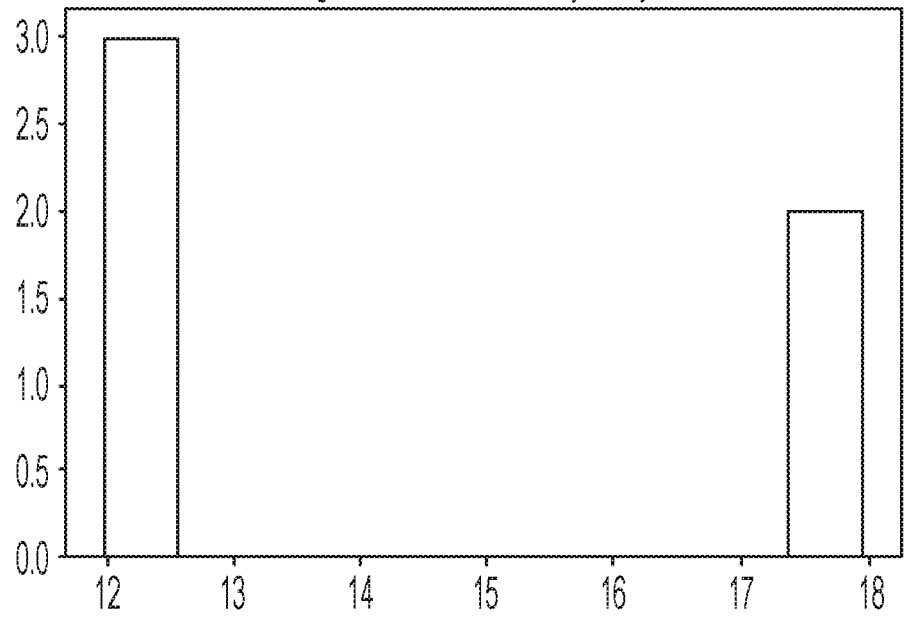

FIGS. 7A-7C illustrate how element $a_{ij}$ of the $n^{th}$ power of the adjacency matrix gives the number of paths of length n between i and j. FIG. 7A shows the square of the adjacency matrix ($A^2$) 700 and the cube of the adjacency matrix ($A^3$) 702. The diagonal elements of the square of the adjacency matrix 700 are plotted below the matrices. The diagonal elements of the cube of the adjacency matrix are plotted in FIG. 7B, and the diagonal elements of the fourth power of the adjacency matrix are plotted in FIG. 7C.

The action of taking the powers of the adjacency matrix can be mapped towards consecutive operations of the quantum shift operator in the random walk. Coupling this to a spectrum inference mechanism such as standard or learning-based quantum phase estimation can give an exponential speed up with respect to a local cycle detection leveraging the classical quantum hybrid approach. As described with respect to FIG. 2, the classical graph is encoded into a quantum object by a preparation circuit. The quantum random walk circuit performs the clique analysis by repeated applications of the walk operator (combination of the coin operator and step operator). The measurement circuit passes the quantum information from the qubits to the classical world for analysis. FIGS. 8A and 8B show an example implementation of the method according to an embodiment of the present invention.

We have described herein a system and method for detection of cliques on a graph by quantum computation according to an embodiment of the present invention. The system includes a quantum processor that takes as input graph structure from a user and outputs realizations associated with the probability of a clique. The quantum computation involves the design of a quantum circuit which first encodes the structure of the graph and then performs parallel evaluations of the different paths on it. The paths are the different routes that can be traversed on the graph. The parallel path traverse is done by means of a circuit embodying a quantum random walk. The clique analysis can be performed by repeated application of the quantum random walk circuit. The quantum walk encodes in its spectrum the clique analysis. Eigenvalues (of the spectrum of the random walk) of higher powers of the shift followed by the quantum coin operator provide a measure of self-cliques. Consequent to the quantum walk sequence, a measurement stage follows, where the information is passed to the classical world for analysis. The quantum computation system and method according to an embodiment of the present invention suppress classical analogs, which can lead to computational polynomial speedup.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of detecting cliques in a graph, comprising:
   determining, based on a number of nodes in said graph, a number of qubits to be included in a quantum processor;
   assigning to each node in said graph, a qubit of said quantum processor having said determined number of qubits;
   operating on said qubits of said quantum processor with a preparation circuit to create a quantum state in said qubits that corresponds to said graph;
   operating on said quantum state in said qubits with a random walk circuit; and
   measuring said qubits of said quantum processor to detect cliques in said graph based on said operating with said random walk circuit,
   wherein said preparation circuit comprises a plurality of single- and two-qubit operators, wherein, for each pair of adjacent nodes in said graph, an operator of said plurality of two-qubit operators acts on a pair of qubits corresponding to said pair of adjacent nodes to create said quantum state.

2. The method according to claim 1, wherein said operator of said plurality of two-qubit operators acts on said pair of qubits corresponding to said pair of adjacent nodes to create said quantum state by flipping a parity of said pair of qubits.

3. The method according to claim 1, wherein said random walk circuit comprises a coin operator and a step operator.

4. The method according to claim 3, wherein said coin operator is a biased coin operator.

5. The method according to claim 3, wherein said coin operator is an unbiased coin operator.

6. The method according to claim 3, wherein said step operator is a conditional operator that changes a position state of the quantum state.

7. The method according to claim 3, wherein eigenvalues of higher powers of said coin operator and said step operator provide a measure of self-cliques.

8. The method according to claim 1, wherein said random walk circuit comprises a pair of operators that are repeated to evaluate a plurality of paths through the graph in parallel.

9. The method according to claim 8, wherein said paths are different routes that can be traversed on said graph.

10. The method according to claim 9, wherein a number of times that the pair of operators is repeated depends on a diameter of said graph.

11. A quantum processor for detecting cliques in a graph, comprising:
    a number of qubits equal to a number of nodes in said graph, wherein each qubit corresponds to a node in said graph;
    a quantum preparation circuit configured to prepare said qubits of said quantum processor in a quantum state corresponding to said graph, said quantum preparation circuit comprising a plurality of two-qubit operators;
    a random walk circuit configured to operate on said qubits prepared in said quantum state; and
    a measurement circuit configured to measure said qubits of said quantum processor to provide an indication of cliques in said graph,
    wherein, for each pair of adjacent nodes of said graph, a two-qubit operator of said plurality of two-qubit operators is configured to operate on a pair of qubits corresponding to said pair of adjacent nodes to create said quantum state.

12. The quantum processor according to claim 11, wherein said operator of said plurality of two-qubit operators acts on said pair of qubits corresponding to said pair of adjacent nodes to create said quantum state by flipping a parity of said pair of qubits.

13. The quantum processor according to claim 11, wherein said random walk circuit comprises a coin operator and a step operator.

14. The quantum processor according to claim 13, wherein said coin operator is a biased coin operator.

15. The quantum processor according to claim 13, wherein said coin operator is an unbiased coin operator.

16. The quantum processor according to claim 13, wherein said step operator is a conditional operator that changes a position state of the quantum state.

17. The quantum processor according to claim 13, wherein eigenvalues of higher powers of said coin operator and said step operator provide a measure of self-cliques.

18. The quantum processor according to claim 11, wherein said random walk circuit comprises a pair of operators that are repeated to evaluate a plurality of paths through the graph in parallel.

19. The quantum processor according to claim 18, wherein said paths are different routes that can be traversed on said graph.

20. The quantum processor according to claim 19, wherein a number of times that the pair of operators is repeated depends on a diameter of said graph.

* * * * *